United States Patent [19]

Real et al.

[11] Patent Number: 4,990,797
[45] Date of Patent: Feb. 5, 1991

[54] REFERENCE VOLTAGE DISTRIBUTION SYSTEM

[75] Inventors: Peter Real, Groveland; David H. Robertson, Somerville; Theodore Tewksbury, Boston; Christopher W. Mangelsdorf, Reading, all of Mass.

[73] Assignee: Analog Devices, Inc., Norwood, Mass.

[21] Appl. No.: 412,416

[22] Filed: Sep. 26, 1989

[51] Int. Cl.$^5$ .................... H03K 3/01; H03K 19/086
[52] U.S. Cl. ...................... 307/296.6; 307/296.1; 307/303; 323/315
[58] Field of Search ............ 307/296.1, 296.6, 296.7, 307/303; 323/268, 313, 315

[56] References Cited

U.S. PATENT DOCUMENTS

| | | | |
|---|---|---|---|
| 3,743,850 | 7/1973 | Davis | 307/296.6 |
| 4,626,771 | 12/1986 | Williams | 307/296.6 |
| 4,678,935 | 7/1987 | Nawata et al. | 307/296.6 |
| 4,904,887 | 2/1990 | Sugiyama et al. | 307/296.6 |
| 4,931,665 | 6/1990 | Yee | 307/296.6 |

Primary Examiner—Stanley D. Miller
Assistant Examiner—Richard Roseen
Attorney, Agent, or Firm—Wolf, Greenfield & Sacks

[57] ABSTRACT

A reference voltage distribution system for use on an integrated circuit to distribute, from a reference voltage input, to remote locations on the chip, precise images of the reference voltage. The system comprises (1) a reference buffer located proximate a reference input connection and (2) a plurality of remote generator blocks, one located at each of the remotely-located sub-blocks or circuits requiring an image of the reference voltage. The reference buffer generates from the reference voltage a number of precision currents, each proportional to the reference voltage. These precision currents are routed to the remote generator blocks. Each remote generator block converts its precision current into a precision reference voltage for local use. These latter reference voltages may be the same as or different from the reference voltage supplied to chip itself.

3 Claims, 2 Drawing Sheets

REFERENCE VOLTAGE DISTRIBUTION SYSTEM

FIELD OF THE INVENTION

The invention pertains to integrated circuit design and layout in general, but is of particular importance for large, precision analog systems.

BACKGROUND

On a typical analog VLSI product, several circuits or sub-blocks in various locations on the integrated circuit's substrate need to be operatively connected to a single reference voltage. This requirement poses extreme challenges in layout routing since parasitic resistance in the conductors for distributing the reference potential and ground will cause the reference level to be different when supplied to disparate portions of the chip, due to I-R drops. This problem is particularly acute at high temperatures, where the metal resistance increases substantially. One way to reduce the resistance is to use wide conductors—i.e., route two wide metal paths across the chip to each sub-block that needs an accurate image of the reference. However, this presents further problems. First, wide paths consume valuable die area. Second, these long runs are susceptible to noise pick up and this susceptibility is increased with larger conductors. Additionally, this situation often is aggravated if other currents are allowed to flow on the reference ground line.

Further, it is quite useful, in some systems, to be able to make slight adjustments to the reference level presented to each sub-block, if the levels presented to all sub-blocks track some primary reference over time and temperature.

Accordingly, it is an object of the present invention to provide a reference voltage distribution system which accurately supplies the same reference voltage to a number of spaced-apart circuits or sub-blocks on an IC chip.

A further object of the invention is to provide such a reference voltage distribution system which reduces increased noise susceptibility.

Another object is to provide a reference voltage distribution system permitting use of less die area for wiring.

Still another object is to provide a reference voltage distribution system which permits individual blocks to be individually controlled.

SUMMARY OF THE INVENTION

The foregoing and other objects are achieved by a reference voltage distribution system which comprises (1) a reference buffer located proximate a reference voltage input connection and (2) a plurality of remote generator blocks, one located at each of the sub-blocks or circuits requiring the reference voltage.

The reference buffer generates from the reference voltage a number of precision currents, each proportional to the reference voltage. These precision currents are routed to the remoted generator blocks. Each remote generator block converts its precision current into a precision reference voltage (or current) for local use. These latter reference voltages may be the same as or different from the reference voltage supplied to chip itself, but in either will proportionately track the reference input voltage.

The remote generator blocks may sometimes be referred to as remote bias generators since the generated voltage is often used for biasing, but this terminology is not meant to suggest any loss of generality; the remotely generated reference may be used for purposes other than biasing, of course.

One current source is provided for each of the n remote generators. Each current source comprises a common-emitter transistor 22-i (where i ranges from 1 to n) and a thin-film, potentially laser-trimmable emitter degeneration resistor 24-i. The same precision drive voltage $V_{ER}$ is applied to the bases of each of transistors 22-i, which establishes the voltage across, and current through, the associated resistor 24i. Of course, this also establishes the output currents IREF1–IREF5, which are supplied to the remote generators.

The external reference voltage, $V_{REF}$, applied to terminal 26, appears across resistor 28, which establishes both the emitter current in transistor 30 and its base voltage. The output of amplifier 32 will supply the proper voltage $V_{IR}$ to maintain these operating conditions for transistor 30.

As the temperature changes, the change in the base-emitter potential ($V_{be}$) of transistor 30 will cause a corresponding change in $V_{BR}$, counteracting the similar $V_{be}$ change occurring in transistors 22-1 through 22-n and maintaining the output currents IREF1–IREFN substantially constant over temperature.

The invention will be more fully understood from the detailed description below, which is presented by way of example only, when read in conjunction with the accompanying drawing.

DETAILED DESCRIPTION

Figure 1:
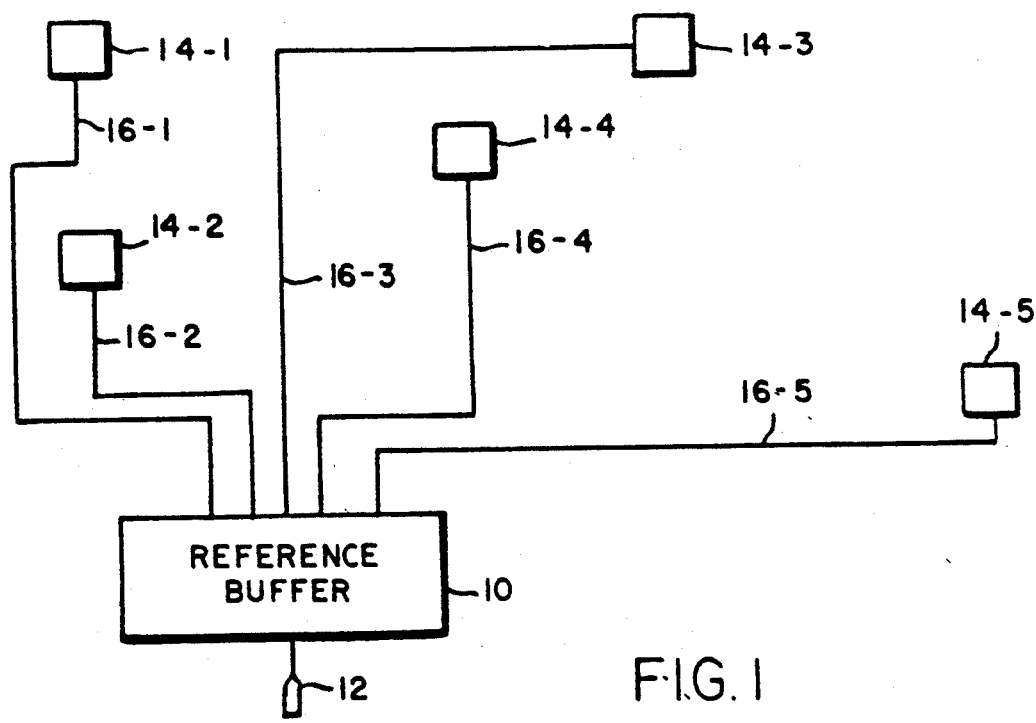
FIG. 1 is a block diagram of a reference voltage distribution system according to the invention.

As stated above, the problem is to produce accurate images of the reference voltage at several locations dispersed across a large analog IC. With reference to FIG. 1, the solution according to the present invention comprises a reference buffer 10, located proximate to the reference input pin 12, and plurality of n remote generator blocks 14<sub>1</sub>–14<sub>n</sub>, one located at each of the n sub-blocks requiring the reference voltage. In the example of FIG. 1, n=5.

Reference buffer 10 generates, from the precision reference input voltage, a number of precision currents, each being proportional to the reference voltage. The precision currents are then routed to each remote generator block over single, minimum width metal lines 16.

Each remote bias generator, such as representative remote generator block 14-1, receives the current from the reference buffer (after travelling across the chip) and converts it back to a reference voltage for local use (i.e., use on the adjacent region of the chip).

Figure 2:
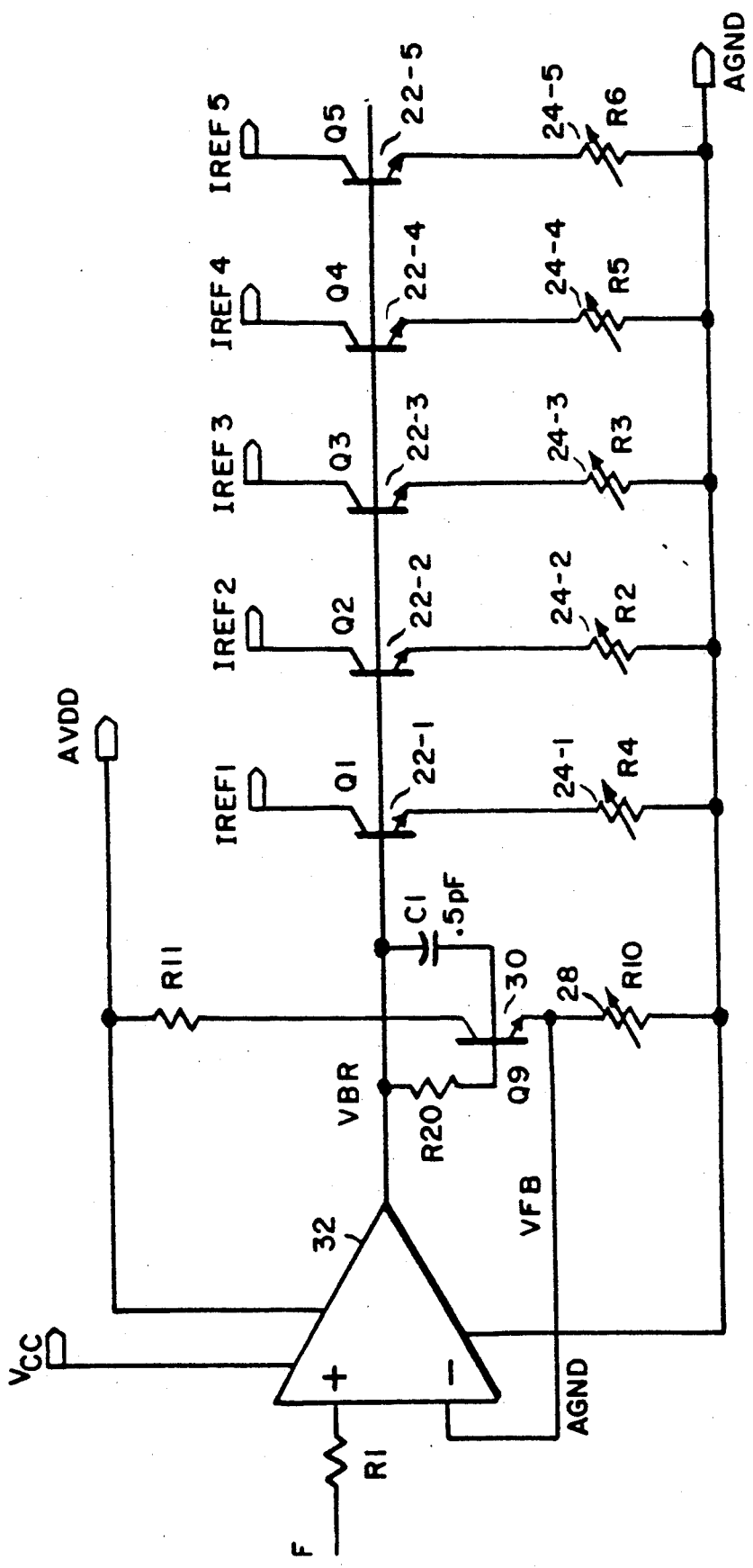
FIG. 2 is a schematic circuit diagram for an exemplary implementation for the reference buffer of FIG. 1.

FIG. 2 illustrates an exemplary circuit implementation of the reference buffer 10. Its structure is similar to the current source section of a current mode digital-to-analog converter (DAC).

Each of the emitter degeneration resistors 22-i may be trimmable, providing the ability to independently adjust the reference levels of each sub-block.

Figure 3:
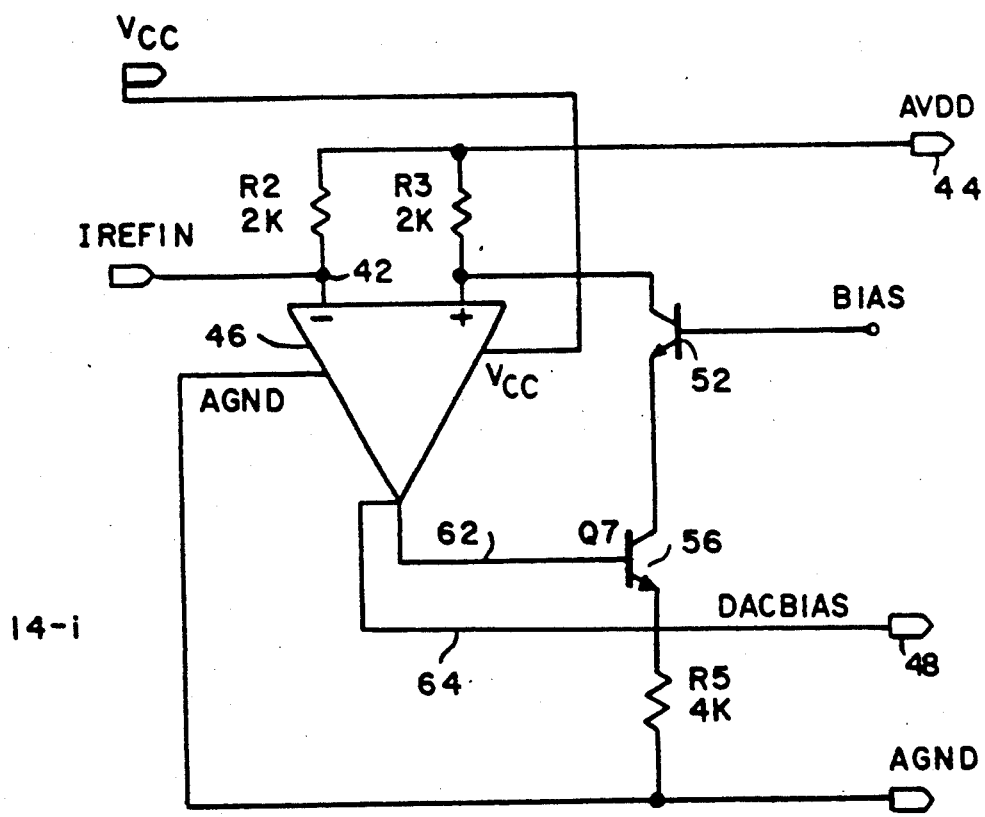
FIG. 3 is a simplified schematic circuit diagram for an exemplary implementation for the remote voltage generator blocks of FIG. 1.

FIG. 3 shows an exemplary embodiment of a representative remote generator 14-i. It is used to produce the local reference voltage DACBIAS from the current coming into the terminal labelled IREFIN (i.e., one of the currents produced by transistors 22-i, such as IREF1). Note that if the input node 42 is forced to the supply voltage AVDD (provided at terminal 44), the DACBIAS signal at the output of amplifier 46 will be forced to ground and the local circuit or block (connected to the DACBIAS terminal 48) can, in effect, be turned off. This is a powerful technique for system trimming and diagnostics. Trimmable resistors R2 and R3 provide bidirectional adjustment of the local reference voltage supplied at terminal 48.

The same voltage as appears across R2 also appears across R3, since operational amplifier 46 has (ideally) infinite input impedance, zero input current and infinite gain. The current through R3 thus must equal the current applied to the IREFIN terminal. This current goes into the collector of transistor 52 and is passed on to resistor R5 through the series connection of transistors 52 and 54 (the current through R5 is slightly higher than the current through resistor R3, of course, as it is augmented by base currents from transistors 52 and 54. The current through R5 establishes the voltage at the base of transistor 54, which is the output voltage of amplifier 46.

The reference voltage is converted to current in resistors 24-i in the reference buffer; the currents are converted back to voltages in resistor R5 of each remote generator. So long as these two resistors have like temperature coefficients, the conversion process will (to a first order analysis) introduce thermal drift.

The invention will thus be seen to require only one "run" or conductor for distributing the reference current to each remote generator (the return coming via the ground conductor which is always assumed to be present for other purposes). The distribution run can be minimally sized and is relatively insensitive to parasitic resistance. Local variations in ground or supply levels do not disturb the operation of the system or the accuracy of the remotely generated references. Additionally, the input of each remote generator can be separately and independently trimmed and calibrated. All remote references track the main reference voltage supplied to the reference input terminal, and may be set either to equal that reference or to be some arbitrary value. As a further advantage, the present system allows remote sub-blocks to be turned off individually, such as for diagnostic purposes, by cutting off the remote generator for the sub-block. If the remote generator supplies bias voltage for the sub-block, turning off the remote genrator forces the bias line to ground potential.

Having thus described an embodiment of the invention, it will be understood that the detailed disclosure was exemplary only, and not limiting. Various alterations, improvements and other implementations will occur to those skilled in the art and are within the spirit and scope of the invention. Accordingly, the invention is limited only by the following claims and equivalents thereto.

What is claimed is:

1. A system for distributing a reference voltage from a reference input terminal to a remote location on an integrated circuit substrate, comprising:
   a. means for generating from the reference voltage a precise current directly proportional to the reference voltage;
   b. means for conveying the precise current to the remote location; and
   c. means at the remote location for receiving the precise current and for generating therefrom a remote reference voltage for use at the remote location.

2. The system of claim 1 wherein the means for generating the precise current is located proximate the reference input terminal.

3. A system for distributing to remote locations on an integrated circuit substrate a plurality of reference voltage values related in a predetermined manner to a reference voltage received at a reference input terminal on the integrated circuit substrate, comprising:
   a. means for generating from the reference voltage a plurality of precise currents each directly proportional to the reference voltage;
   b. means for conveying each of the precise currents to a predetermined remote location on the integrated circuit substrate; and
   c. at each such remote location, means for receiving the precise current and for generating therefrom a remote reference voltage value for use at the remote location.

* * * * *